(12) United States Patent
Shi et al.

(10) Patent No.: US 10,705,257 B2
(45) Date of Patent: Jul. 7, 2020

(54) DISPLAY PANEL, BACKLIGHT MODULE AND DISPLAY DEVICE

(71) Applicants: BOE Technology Group Co., Ltd., Beijing (CN); Chengdu BOE Optoelectronics Technology Co., Ltd., Chengdu (CN)

(72) Inventors: Bo Shi, Beijing (CN); Yuanming Feng, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

(*) Notice: Subject to any disclaimer, the term of this patent is extended or adjusted under 35 U.S.C. 154(b) by 0 days.

(21) Appl. No.: 16/106,544

(22) Filed: Aug. 21, 2018

(65) Prior Publication Data
US 2019/0219872 A1    Jul. 18, 2019

(30) Foreign Application Priority Data
Jan. 18, 2018  (CN) .......................... 2018 1 0047850

(51) Int. Cl.
G02B 1/00       (2006.01)
(52) U.S. Cl.
CPC .......... *G02B 1/005* (2013.01); *G02F 2202/32* (2013.01)
(58) Field of Classification Search
CPC ............................ G02F 2202/32; G02B 1/005
See application file for complete search history.

(56) References Cited

U.S. PATENT DOCUMENTS

| 9,927,651 | B2 | 3/2018 | Hu |
| 2014/0104676 | A1 | 4/2014 | Suh et al. |
| 2017/0293182 | A1* | 10/2017 | Hu ................... G02F 1/133514 |
| 2018/0016477 | A1* | 1/2018 | Inoue ..................... B32B 27/00 |

FOREIGN PATENT DOCUMENTS

| CN | 102645786 A | 8/2012 |
| CN | 103091756 A | 5/2013 |
| CN | 105353556 A | 2/2016 |
| CN | 106681046 A | 5/2017 |
| JP | 2006139050 A | 6/2006 |

OTHER PUBLICATIONS

First Office Action, including Search Report, for Chinese Patent Application No. 201810047850.5, dated Jan. 2, 2020, 18 pages.

* cited by examiner

*Primary Examiner* — Thanh Nhan P Nguyen
(74) *Attorney, Agent, or Firm* — Westman, Champlin & Koehler, P.A.

(57) ABSTRACT

A display panel, a backlight module and a display device are provided in embodiments of the disclosure, the display panel comprising: a first substrate and a second substrate provided opposite to the first substrate, and a plurality of pixels arranged in an array between the first substrate and the second substrate, each pixel comprising at least three sub-pixels of different colors; and a region of the display panel corresponding to at least one of the sub-pixels of different colors is further provided with a respective photonic crystal layer, which is configured to filter a light ray in a predetermined waveband and to obtain a color of an emergent light from the region of the display panel corresponding to the at least one of the sub-pixels similar to an object color thereat.

15 Claims, 5 Drawing Sheets

DISPLAY PANEL, BACKLIGHT MODULE AND DISPLAY DEVICE

CROSS-REFERENCE TO RELATED DISCLOSURE

The present disclosure claims the benefit of Chinese Patent Application Disclosure No. 201810047850.5 filed on Jan. 18, 2018 in the State Intellectual Property Office of China, the whole disclosure of which is incorporated herein by reference.

BACKGROUND OF THE DISCLOSURE

Field of the Disclosure

Embodiments of the present disclosure relate to the technical field of display technology, and especially to a display panel, a backlight module and a display device.

Description of the Related Art

A Flat Panel Display (abbreviated as FPD) gradually becomes a mainstream product in market, with increasingly more types thereof, such as Liquid Crystal Display (abbreviated as LCD), Organic Light Emitted Diode (abbreviated as OLED), Plasma Display Panel (abbreviated as PDP) and Field Emission Display (abbreviated as FED), and the like.

A display panel of relevant art may typically use a color resistant film layer, e.g., the LCD display panel may typically be provided with the color resistant film layer at a light-emergent side of its backlight module so as to convert a light form the backlight module into light of different color(s). The OLED display panel may also for example be equipped with white OLED devices cooperating with the color resistant film layer so as to implement a colored display.

Due to different application scenarios, there may be different requirements on colors of the display panel correspondingly; in other words, as to different types of display panels, specifications thereof concerning red, green, blue colors may vary. For this purpose, it is necessary to develop different photoresist materials each of which may cooperate with a certain backlight so as to obtain, e.g., a blue photoresist material meeting a requirement on specification of a dominant wavelength which is equal to 469 nm.

SUMMARY OF THE DISCLOSURE

The embodiments of the present disclosure have been made to overcome or alleviate at least one aspect of the above mentioned disadvantages and/or shortcomings in the prior art, by providing a display panel, a backlight module and a display device.

Following technical solutions are adopted in exemplary embodiments of the disclosure for achieving the above desired technical purposes.

According to an aspect of the exemplary embodiment of the present disclosure, there is provided a display panel, comprising: a first substrate and a second substrate provided opposite to the first substrate, and a plurality of pixels arranged in an array between the first substrate and the second substrate, each pixel comprising at least three sub-pixels of different colors, wherein a region of the display panel corresponding to at least one of the sub-pixels of different colors is further provided with a photonic crystal layer, which is configured to filter a light ray in a predetermined waveband and to obtain a color of an emergent light from the region of the display panel corresponding to the at least one of the sub-pixels similar to an object color thereat.

In the display panel provided by an embodiment of the disclosure, each of the sub-pixels comprises a liquid crystal layer and a photoresist layer of a corresponding color; and the photonic crystal layer is arranged in one of positional relationships relative to the first substrate, the second substrate and the crystal layer: the photonic crystal layer is located at a side of the first substrate facing towards the liquid crystal layer; the photonic crystal layer is located at a side of the second substrate facing towards the liquid crystal layer; the photonic crystal layer is located at a side of the first substrate facing away from the liquid crystal layer; and the photonic crystal layer is located at a side of the second substrate facing away from the liquid crystal layer.

In the display panel provided by an embodiment of the disclosure, each of the sub-pixels comprises an organic electroluminescent structure of a corresponding color; and the photonic crystal layer is located at a light-emergent side of the organic electroluminescent structure.

In the display panel provided by an embodiment of the disclosure, each of the sub-pixels comprises a photoresist layer of a corresponding color and an organic electroluminescent structure which emits a white light, the photoresist layer being located at a light-emergent side of the organic electroluminescent structure; and the photonic crystal layer is located at a light-emergent side of the organic electroluminescent structure, and one of the photonic crystal layer and the organic electroluminescent structure is arranged between the photoresist layer and the other of the photonic crystal layer and the organic electroluminescent structure.

In the display panel provided by an embodiment of the disclosure, each pixel comprises sub-pixels of three different colors, comprising a red sub-pixel, a green sub-pixel and a blue sub-pixel; and the photonic crystal layer is at least provided in a region of the display panel corresponding to the blue sub-pixel.

In the display panel provided by an embodiment of the disclosure, a portion of the photonic crystal layer provided in the region corresponding to the blue sub-pixel is configured to filter a light ray in a waveband between 380 nm and 435 nm; a portion of the photonic crystal layer provided in a region corresponding to the red sub-pixel is configured to filter a light ray in a waveband between 415 nm and 435 nm; and a portion of the photonic crystal layer provided in a region corresponding to the green sub-pixel is configured to filter a light ray in a waveband between 515 nm and 525 nm.

In the display panel provided by an embodiment of the disclosure, the photonic crystal layer comprises a base film layer and micropores formed and distributed uniformly in the base film layer, the micropores having a refractive index smaller than that of the base film layer.

In the display panel provided by an embodiment of the disclosure, the base film layer is formed by a polymeric material formed by a three-dimensional stacking of spherical polymer structures abutting one another tightly.

In the display panel provided by an embodiment of the disclosure, the base film layer is formed by a polymeric material formed by a three-dimensional stacking of one type of polystyrene microspheres, polymethylacrylic acid microspheres, and silicon dioxide microspheres.

According to another aspect of the exemplary embodiment of the present disclosure, there is provided a backlight module for a liquid crystal display panel, comprising a backlight source configured to provide a light source for the liquid crystal display panel, the liquid crystal panel comprising a plurality of pixels each of which comprise at least three sub-pixels of different colors, wherein the backlight module further comprises a photonic crystal layer located at a light-emergent side of the backlight source, in a region thereof corresponding to at least one of the sub-pixels of different colors of the liquid display panel, and the photonic crystal layer being configured to filter a light ray in a predetermined waveband and to obtain a color of an emergent light from the region of the display panel corresponding to the at least one of the sub-pixels similar to an object color thereat.

In the backlight module provided by an embodiment of the disclosure, each pixel comprises sub-pixels of three different colors, comprising a red sub-pixel, a green sub-pixel and a blue sub-pixel; and the photonic crystal layer is at least provided in a region of the backlight module corresponding to the blue sub-pixel.

In the backlight module provided by an embodiment of the disclosure, a portion of the photonic crystal layer provided in the region of the backlight module corresponding to the blue sub-pixel is configured to filter a light ray in a waveband between 380 nm and 435 nm; a portion of the photonic crystal layer provided in a region of the backlight module corresponding to the red sub-pixel is configured to filter a light ray in a waveband between 415 nm and 435 nm; and a portion of the photonic crystal layer provided in a region of the backlight module corresponding to the green sub-pixel is configured to filter a light ray in a waveband between 515 nm and 525 nm.

In the backlight module provided by an embodiment of the disclosure, the photonic crystal layer comprises a base film layer and micropores formed and distributed uniformly in the base film layer, the micropores having a refractive index smaller than that of the base film layer.

In the backlight module provided by an embodiment of the disclosure, the base film layer is formed by a polymeric material formed by a three-dimensional stacking of spherical polymer structures abutting one another tightly.

In the backlight module provided by an embodiment of the disclosure, the base film layer is formed by a polymeric material formed by a three-dimensional stacking of one type of polystyrene microspheres, polymethylacrylic acid microspheres, and silicon dioxide microspheres.

According to still another aspect of the exemplary embodiment of the present disclosure, there is provided a display device, comprising the display panel as above.

According to yet another aspect of the exemplary embodiment of the present disclosure, there is provided a display device, comprising the backlight module as above.

BRIEF DESCRIPTION OF THE DRAWINGS

The above and other features and advantages of the present disclosure will become more apparent and a more comprehensive understanding of the present disclosure can be obtained, by describing in detail exemplary embodiments thereof with reference to the accompanying drawings, in which.

DETAILED DESCRIPTION OF EMBODIMENTS OF THE DISCLOSURE

Figure 1:
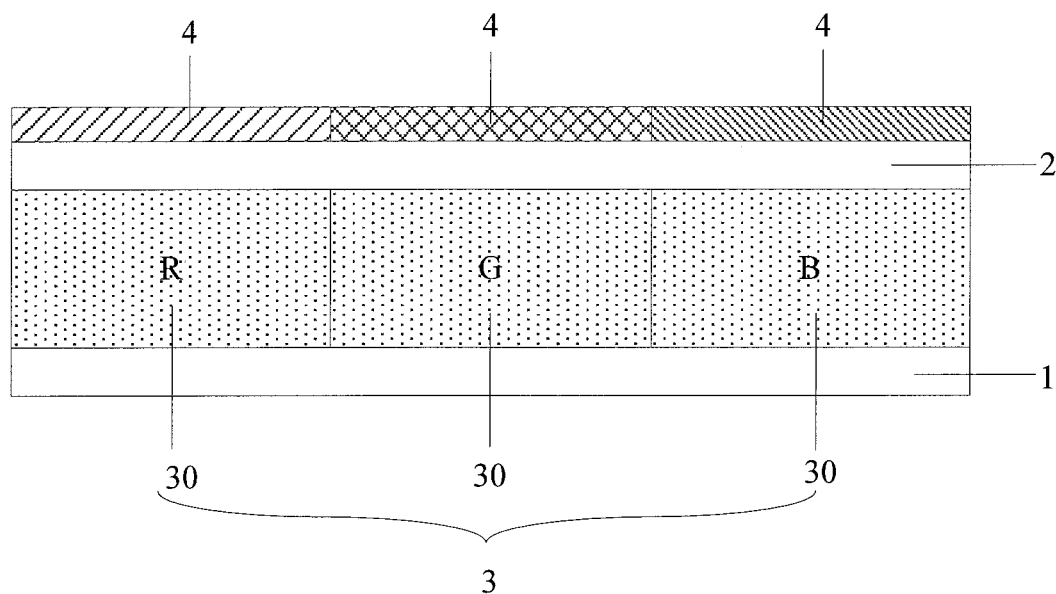
FIG. 1 illustrates a schematic structural cross-sectional view of a display panel according to an embodiment of the disclosure.

A photonic crystal material refers to a material which is provided with a special lattice structure which may respond to incoming light. Specifically, just like a instance in which there are ions appearing periodically at lattices sites (i.e., at sites where various atoms are located) in a semiconductor material, then, in the photonic crystal material, there is a material having a relatively smaller refractive index (named as "sites of low refractive index", e.g., air-filled cavities/voids formed manually) existing periodically at some locations in another material having a relatively larger refractive index (named as "sites of high refractive index"); and due to the periodical structure created by an alternative arrangement between the sites of high refractive index and the sites of low refractive index therein, photonic band gaps may be formed similar to a forbidden band or forbidden energy gap in a semiconductor material. The photonic crystal material may modulate electromagnetic waves having corresponding wavelength(s); in other words, when an electromagnetic wave propagates in the lattice structure of the photonic crystal material, it may be modulated due to the existence of Bragg scattering, then it energy forms an energy band structure in which the band gaps (i.e., photonic band gaps) emerge between adjacent energy bands, such that photons each having energy within the photonic band gap(s) may fail to enter the photonic crystal material. And distances among the sites of low refractive index arranged periodically within the photonic crystal material are equal to one another, resulting in a band gap effect applied merely to an optical wave of a certain frequency by the photonic crystal material having the sites of low refractive index arranged periodically at a regular distance (referred to as period distance hereinafter). In other words, only a light wave of a specific frequency may be prevented completely from propagating in the photonic crystal material having a specific period distance.

In embodiments of the disclosure, by designing and forming in a reasonable way the lattice structure of the photonic crystal material, then the energy band structure of the photonic crystal material may be designed accordingly. By the photonic crystal material thus formed, light of a certain waveband may be filtered out, so as to further implement a fine adjustment on lights of various colors emitting from a display panel of the relevant art, and thus to meet a requirement on various specifications of colors of emergent light.

To this end, a display panel, a backlight module and a display device are provided in embodiments of the disclosure.

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the disclosure in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective dimension and shape of each component in the drawings are only intended to exemplarily illustrate the contents of the disclosure, rather than to demonstrate the practical dimension or proportion of components of a display panel, a backlight module and a display device.

According to a general technical concept of embodiments of the present disclosure, in a first aspect of the embodiments of the disclosure, there is provided a display panel, as illustrated in FIG. 1, comprising: a first substrate 1 and a second substrate 2 provided opposite to the first substrate 1, and a plurality of pixels 3 arranged in an array (e.g., arranged in a matrix) between the first substrate 1 and the second substrate 2, each pixel 3 of the plurality of pixels comprising at least three sub-pixels 30 of different colors. A region of the display panel corresponding to at least one of the sub-pixels of different colors is further provided with a photonic crystal layer 4 (e.g., located on a side of the second substrate 2 facing away from the first substrate 1), the photonic crystal layer 4 being configured to filter a light ray in a predetermined waveband so as to obtain a color of an emergent light from the region of the display panel corresponding to the at least one of the sub-pixels 30 similar to or even equal to an intended object color thereat.

As to the display panel provided in the embodiment of the disclosure, since the photonic crystal layer is provided in a region of the display panel corresponding to at least one of the sub-pixels of different colors, and is for example configured to filter a light ray in a predetermined waveband, then, a fine adjustment on colors of emergent light emitted from the sub-pixels may further be implemented by the photonic crystal layer, such that a color of an emergent light from the region of the display panel corresponding to the at least one of the sub-pixels 30 may be similar to an intended object color thereat, so as to meet a requirement on various specification of colors of emergent light.

Specifically, in the display panel according to an embodiment of the disclosure, each pixel comprises sub-pixels of three different colors, specifically, comprising a red (R) sub-pixel, a green (G) sub-pixel and a blue (B) sub-pixel.

And it should be noticed that, in all the figures of the embodiments of the disclosure, by way of example, it is illustrated that each pixel 3 comprises sub-pixels 30 of three different colors, i.e., R, G, B sub-pixels, and the regions corresponding to R, G, B sub-pixels respectively are provided with respective photonic crystal layers 4, for illustration schematically.

Specifically, the display panel provided in embodiments of the disclosure may be considered to be equivalent to a display panel constructed on the basis of a colored display panel in the relevant art by adding a photonic crystal layer, which photonic crystal layer is located on a side of one substrate facing away from an opposite substrate and is configured to be used to filter a light ray in a predetermined waveband, so as to implement a fine adjustment on fine adjustment on colors of emergent light emitted from the colored display panel in the relevant art. Therefore, by providing the photonic crystal layer to filter a light of a specific waveband, a specific requirement of colors may be met.

Figure 2:
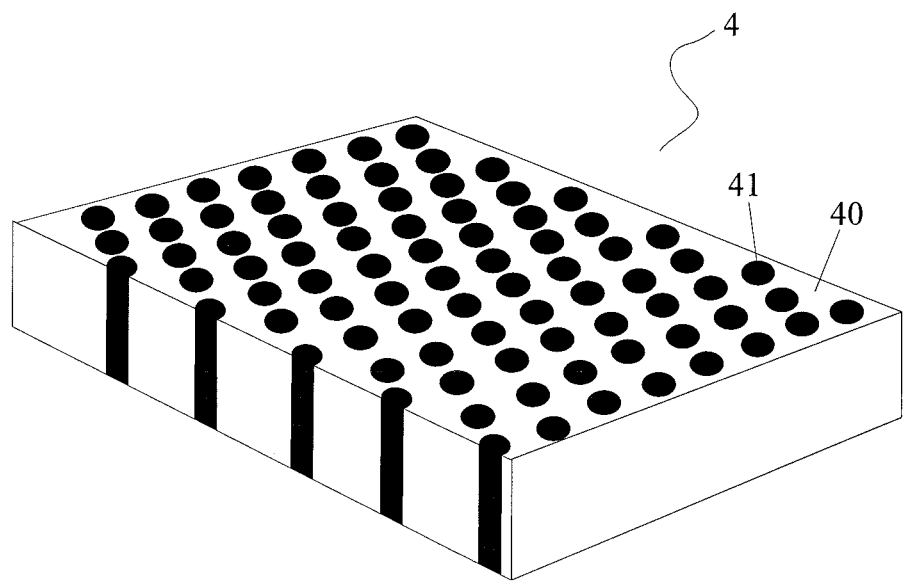
FIG. 2 illustrates a schematic perspective view of a photonic crystal layer of the display panel according to an embodiment of the disclosure.

Specifically, in the display panel provided in embodiments of the disclosure, as illustrated in FIG. 2, the photonic crystal layer 4 is formed by a base film pixels 40 and micropores 41 formed and distributed uniformly in the base film layer 40, the micropores 41 having a refractive index smaller than that of the base film layer 40.

Specifically, important structural parameters of the photonic crystal layer comprise aperture size(s) of the micropores, distances among the micropores, depth(s) of the micropores; and by controlling these parameters, different dielectric constants may be obtained so as to modulate the electromagnetic waves passing therethrough and thus to filter light rays of different wavebands.

Specifically, in the display panel provided in embodiments of the disclosure, the micropores in the base film layer is for example formed by etching; accordingly, a material of the base film layer is for example a silicon-based (Si-based) semiconductor material or a metal-oxide semiconductor material, or alternatively for example a light-sensitive resin material. Of course, it may also alternatively be any other material etched to have micropore structures.

Figure 3:
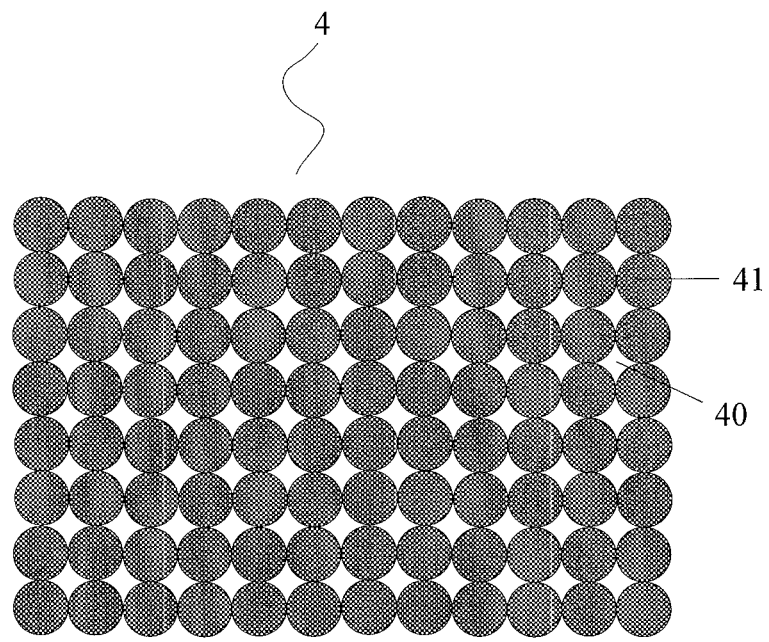
FIG. 3 illustrates a schematic top view of a photonic crystal layer of the display panel according to an embodiment of the disclosure.

However, since the micropores in the photonic crystal layer have relatively small aperture sizes, typically at nano-scale sizes, then, there is a relatively high requirement on the etching process, and it is relatively difficult to obtain micropores of such sizes by relevant etching technology. Therefore, in the display panel provided in embodiments of the disclosure, as illustrated in FIG. 3, the material of the base film pixels 40 is implemented as a polymeric material formed by a three-dimensional stacking of spherical polymer structures abutting one another tightly, with gaps/voids in the three-dimensional stacking of spherical polymer structures equivalently functioning as the micropores 41 of the base film layer 40.

In specific implementation, the photonic crystal layer is for example prepared by one or more of sputtering, quasi-equilibrium evaporation, gravity deposition/sedimentation, spin coating. By controlling diameters of the micropores of each of the spherical polymer structures during preparation, then, aperture sizes and depths of the micropores, and spaces/intervals among the micropores, as defined (e.g., in advance) may be controlled.

By way of example, in the display panel provided in embodiments of the disclosure, the material of the base film layer is for example a polymeric material formed by a three-dimensional stacking of polystyrene microspheres, polymethylacrylic acid microspheres, or silicon dioxide microspheres, without being defined or limited herein specifically.

Specifically, in the display panel provided in embodiments of the disclosure, for example, the photonic crystal layer is provided on a light emergent side so as to ensure that any light may pass through the photonic crystal layer before outgoing/shooting out from the display panel. Then a liquid crystal display panel and an OLED display panel are taken as examples to illustrate specific positioning of the photonic crystal layer, as set forth in detail hereinafter.

In a condition that the display panel is the liquid crystal display panel, since the liquid crystal display panel is a passive light-emitting device which may not emit light itself, then a backlight module is required to provide a light source for the liquid crystal display panel so as to ensure the liquid crystal display panel may display images. Therefore, in specific implementation, the photonic crystal layer is for example located at any position of the region(s) of the display panel corresponding to the sub-pixel(s).

Specifically, in a condition that the display panel is the liquid crystal display panel, as illustrated in FIG. 4 to FIG. 7, each of the sub-pixels 30 comprises a liquid crystal layer 301 and a photoresist layer 302 of a corresponding color. For example, each red sub-pixel 30 is provided therein with a red photoresist layer 302, each blue sub-pixel 30 is provided therein with a blue photoresist layer 302, and each green sub-pixel 30 is provided therein with a green photoresist layer 302.

Figure 4:
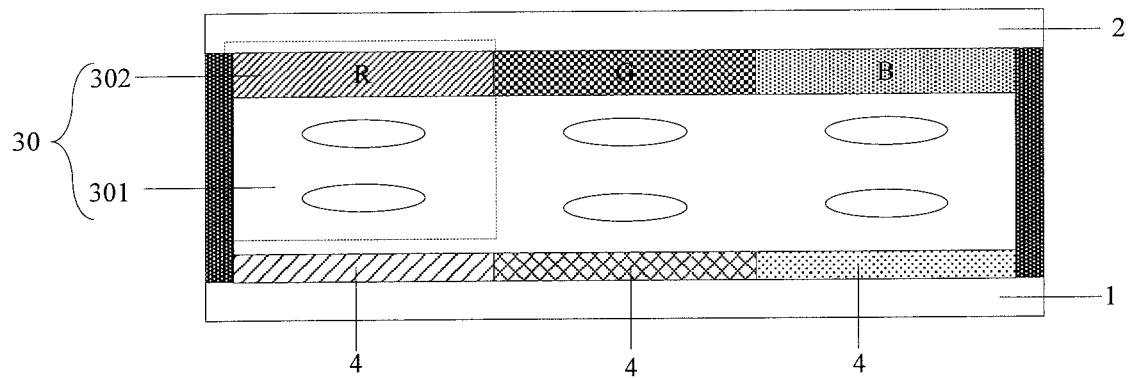
FIG. 4 illustrates a schematic structural cross-sectional view of a display panel according to another embodiment of the disclosure.
Figure 5:
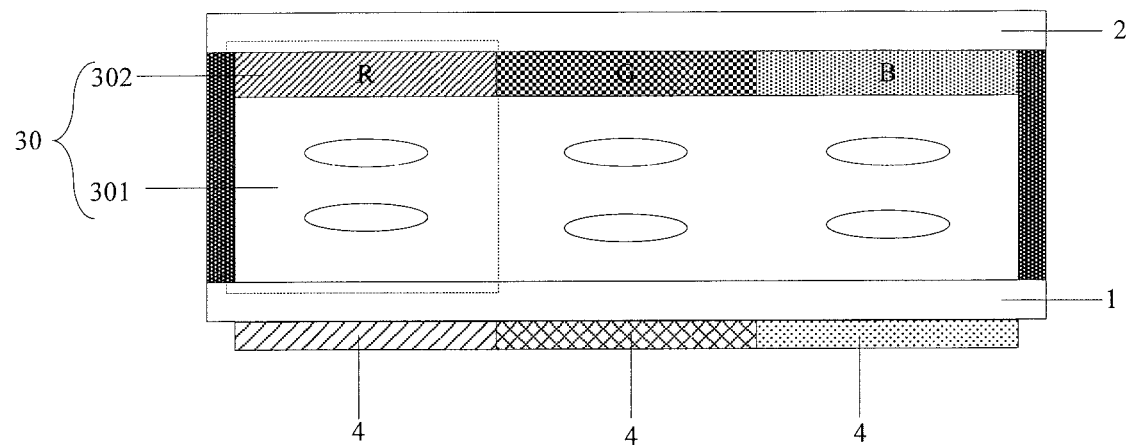
FIG. 5 illustrates a schematic structural cross-sectional view of a display panel according to still another embodiment of the disclosure.
Figure 6:
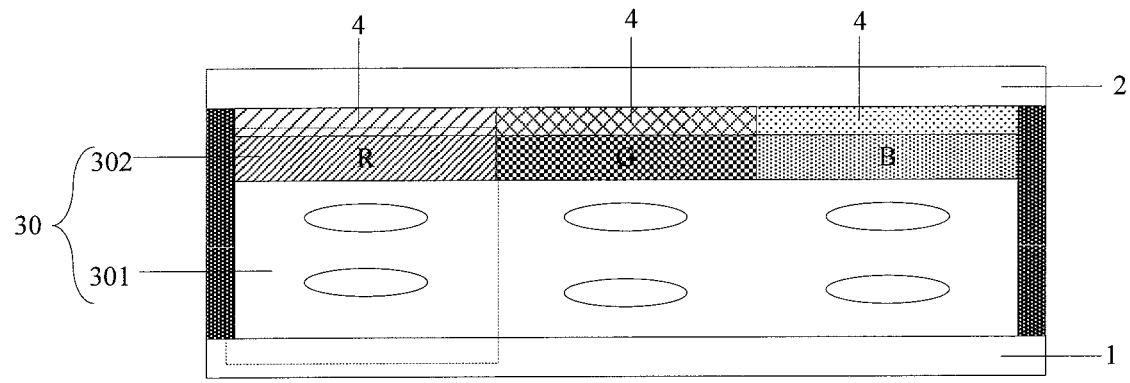
FIG. 6 illustrates a schematic structural cross-sectional view of a display panel according to yet another embodiment of the disclosure.
Figure 7:
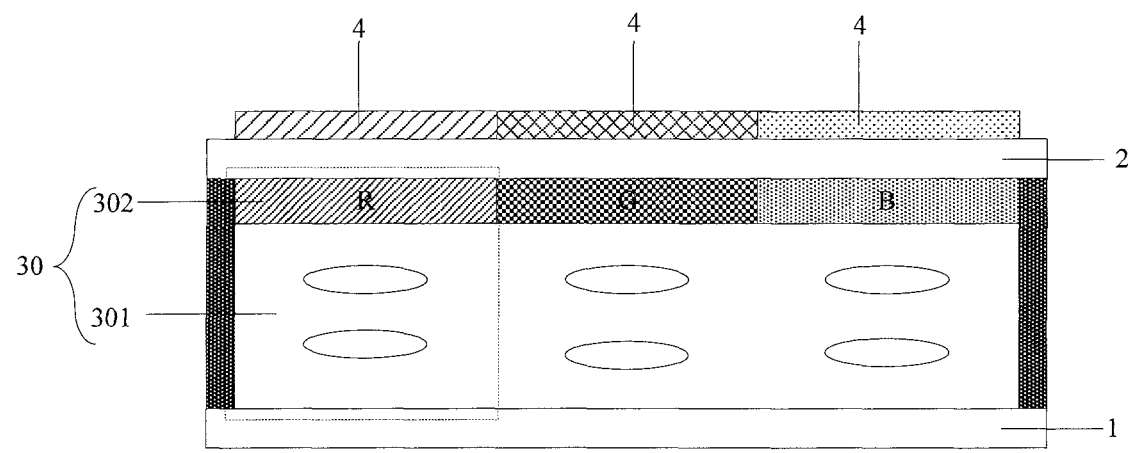
FIG. 7 illustrates a schematic structural cross-sectional view of a display panel according to still yet another embodiment of the disclosure.

By way of example, in the display panel provided in an embodiment of the disclosure, as illustrated in FIG. 4, the photonic crystal layer 4 is located at a side of the first substrate 1 facing towards the liquid crystal layer 301;

By way of example, in the display panel provided in an embodiment of the disclosure, as illustrated in FIG. 5, the photonic crystal layer 4 is located at a side of the first substrate 1 facing away from the liquid crystal layer 301;

By way of example, in the display panel provided in an embodiment of the disclosure, as illustrated in FIG. 6, the photonic crystal layer 4 is located at a side of the second substrate 2 facing towards the liquid crystal layer 301; and By way of example, in the display panel provided in an embodiment of the disclosure, as illustrated in FIG. 7, the photonic crystal layer 4 is located at a side of the second substrate 2 facing away from the liquid crystal layer 301.

Specifically, in a condition that the display panel provided in an embodiment of the disclosure is the liquid crystal display panel, the first substrate is an array substrate and the second substrate is an opposite substrate, then, the photoresist layer may for example be located at a side of the array substrate, or for example be alternatively or additionally located at a side of the opposite substrate, without being defined/limited herein specifically.

Furthermore, in the liquid crystal display panel provided in the embodiment of the disclosure, a light originating from the backlight module may firstly pass through the photonic crystal layer and then pass through the photoresist layer; of course, the light originating from the backlight module may also for example firstly pass through the photoresist layer and then pass through the photonic crystal layer, without defining or limiting specific relative positions of the photonic crystal layer and the photoresist layer.

Figure 8:
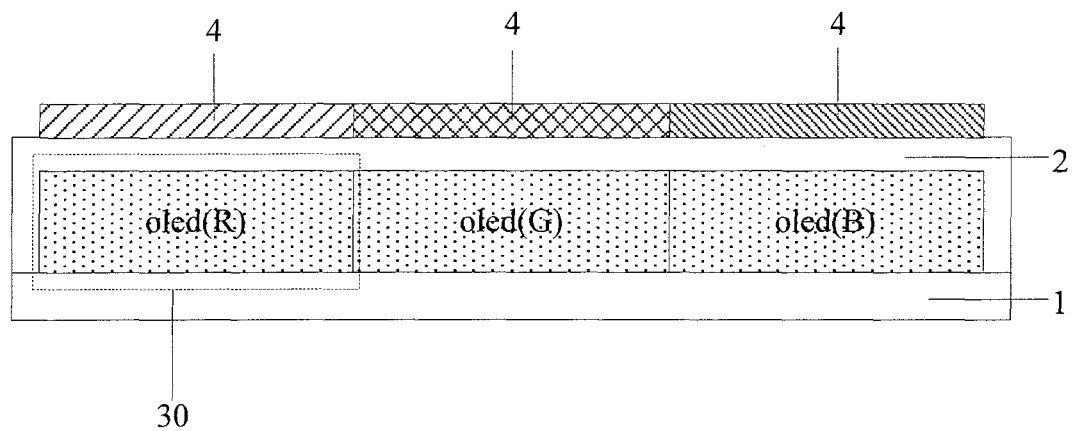
FIG. 8 illustrates a schematic structural cross-sectional view of a display panel according to a further embodiment of the disclosure.

By way of example, in a condition that the display panel provided in the embodiment of the disclosure is the OLED display panel, as illustrated in FIG. 8, each of the sub-pixels 30 comprises an organic electroluminescent structure of a corresponding color, i.e., OLED (R), OLED (B) or OLED (G). For example, each red sub-pixel 30 comprises a red organic electroluminescent structure OLED (R), each blue sub-pixel 30 comprises a blue organic electroluminescent structure OLED (B), and each green sub-pixel 30 comprises a green organic electroluminescent structure OLED (G).

And each of corresponding photonic crystal layers 4 may be located at a respective light-emergent side of a corresponding one of the organic electroluminescent structure OLED (R), OLED (B) and OLED (G).

Figure 9:
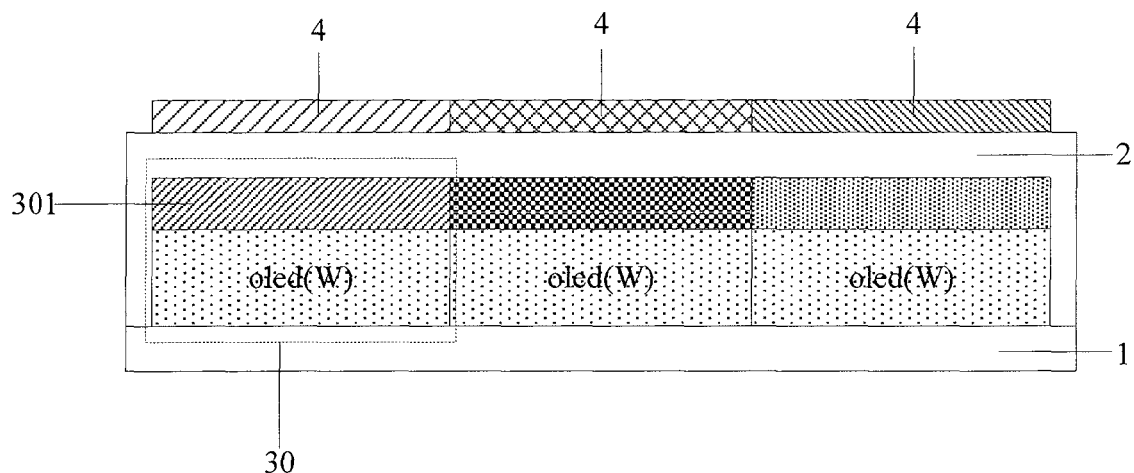
FIG. 9 illustrates a schematic structural cross-sectional view of a display panel according to further another embodiment of the disclosure.

Or alternatively, for example, in a condition that the display panel provided in the embodiment of the disclosure is the OLED display panel (e.g., a white OLED), as illustrated in FIG. 9, then, each of the sub-pixels 30 comprises a photoresist layer 301 of a corresponding color and an organic electroluminescent structure which emits a white light, which is referred to as OLED (W), and the photoresist layer 301 is located at a light-emergent side of the organic electroluminescent structure OLED (W).

A corresponding photonic crystal layer 4 is located at a light-emergent side of the organic electroluminescent structure OLED (W). By way of example, the corresponding photonic crystal layer 4 is arranged between the organic electroluminescent structure OLED (W) and the photoresist layer 301; in an alternative embodiment of the disclosure, the organic electroluminescent structure OLED (W) is arranged between the corresponding photonic crystal layer 4 and the photoresist layer 301.

Furthermore, in the OLED display panel provided in the embodiment of the disclosure, a light originating from the organic electroluminescent structure may for example firstly pass through the photonic crystal layer and then pass through the photoresist layer; of course, the light originating from the organic electroluminescent structure may for example alternatively firstly pass through the photoresist layer and then pass through the photonic crystal layer, without defining or limiting specific relative positions of the photonic crystal layer and the photoresist layer.

In specific implementation, the organic electroluminescent structure comprises an anode layer, a light emitting layer and a cathode layer, as in relevant art, without discussing repeatedly herein any more.

Specifically, since the color of the light emitted by the blue sub-pixels in the display panel in the relevant art may hardly meet specifications desired by the market, then, in the display panel provided in the embodiment of the disclosure, the corresponding photonic crystal layer(s) may be provided in the region(s) of the display panel corresponding to the blue sub-pixels. Of course, as per practical requirements, for example, in regions of the display panel corresponding to sub-pixels of other colors, corresponding photonic crystal layers may be provided additionally, without being defined or limiting herein specifically.

Furthermore, in the display panel provided in the embodiment of the disclosure, typically, in a condition that corresponding photonic crystal layers in the regions of the display panel corresponding to sub-pixels of different colors may be required to filter light of identical wave band, then, these photonic crystal in the regions of the display panel corresponding to the sub-pixels of different colors may be the same in structure thereof. In a condition that corresponding photonic crystal layers in the regions of the display panel corresponding to sub-pixels of different colors may be required to filter light of different wave bands, or to filter light of at least not exactly identical wave bands, then, these photonic crystal layers in the regions of the display panel corresponding to sub-pixels of different colors may be different or at least not exactly the same.

For example, in the display panel provided in the embodiment of the disclosure, a portion of the photonic crystal layer provided in the region of the display panel corresponding to the blue sub-pixel is configured to filter a light ray in a waveband between 380 nm and 435 nm;

For example, in the display panel provided in the embodiment of the disclosure, a portion of the photonic crystal layer provided in a region of the display panel corresponding to the red sub-pixel is configured to filter a light ray in a waveband between 415 nm and 435 nm; and For example, in the display panel provided in the embodiment of the disclosure, a portion of the photonic crystal layer provided in a region of the display panel corresponding to the green sub-pixel is configured to filter a light ray in a waveband between 515 nm and 525 nm.

The display panel having sub-pixels of three different colors R, G, B may be verified, and in a condition that the photonic crystal layers are not provided, the display panel emits a red light having a wavelength of 624 nm, a green light having a wavelength of 548 nm and a blue light having a wavelength of 468 nm. And in a condition that a photonic crystal layer having a filtering wave band between 380 nm and 435 nm is provided in each region corresponding to each B sub-pixel, then the wavelength of the blue light may be changed into 469 nm; and in a condition that a photonic crystal layer having a filtering wave band of 450 nm is provided in each region corresponding to each B sub-pixel, then the wavelength of the blue light may be changed into 470 nm; and in a condition that a photonic crystal layer having a filtering wave band between 435 nm and 450 nm is provided in each region corresponding to each B sub-pixel, then the wavelength of the blue light may be changed into 475 nm. And in a condition that a photonic crystal layer having a filtering wave band between 380 nm and 435 nm is provided in each region corresponding to each G sub-pixel, then the wavelength of the green light may be changed into 548 nm; and in a condition that a photonic crystal layer having a filtering wave band of 520 nm is provided in each region corresponding to each G sub-pixel, then the wavelength of the green light may be changed into 550 nm. And in a condition that a photonic crystal layer having a filtering wave band between 380 nm and 435 nm is provided in each region corresponding to each R sub-pixel, then the wavelength of the red light may be changed into 623 nm. Specific results of simulations are illustrated in Table 1 as shown below:

TABLE 1

Results of Simulations

| | Color | x | y | Y | λ (nm) | Sat |
|---|---|---|---|---|---|---|
| Full wave band | R | 0.667 | 0.304 | 29.48% | 624 | 94% |
| | G | 0.295 | 0.655 | 66.85% | 548 | 86% |
| | B | 0.146 | 0.072 | 8.54% | 468 | 92% |
| 380-435 nm being filtered | R | 0.669 | 0.305 | 15.29% | 623 | 94% |
| | G | 0.295 | 0.655 | 66.89% | 548 | 86% |
| | B | 0.145 | 0.076 | 8.50% | 469 | 92% |
| 450 nm being filtered | B | 0.143 | 0.085 | 8.18% | 470 | 90% |
| 535-450 nm being filtered | B | 0.136 | 0.114 | 7.90% | 475 | 89% |
| 520 nm being filtered | G | 0.303 | 0.649 | 66.40% | 550 | 88% |

As may be seen from above, the photonic crystal layers implement a fine adjustment on wavelengths of colors of emergent light emitted from the display panel, and since the photonic crystal layers have different filtering wave bands, then respective wavelengths of colors of the emergent light may be different accordingly. Therefore, in specific implementation, e.g., by designing the filtering wave bands of the photonic crystal layers, then colors of emergent light of different specifications may be obtained. And the design of the filtering wave bands of the photonic crystal layers may be implemented, by a reasonable design and formation of the lattice structure of the photonic crystal material and a corresponding design of the energy band structure of the photonic crystal material.

Figure 10:
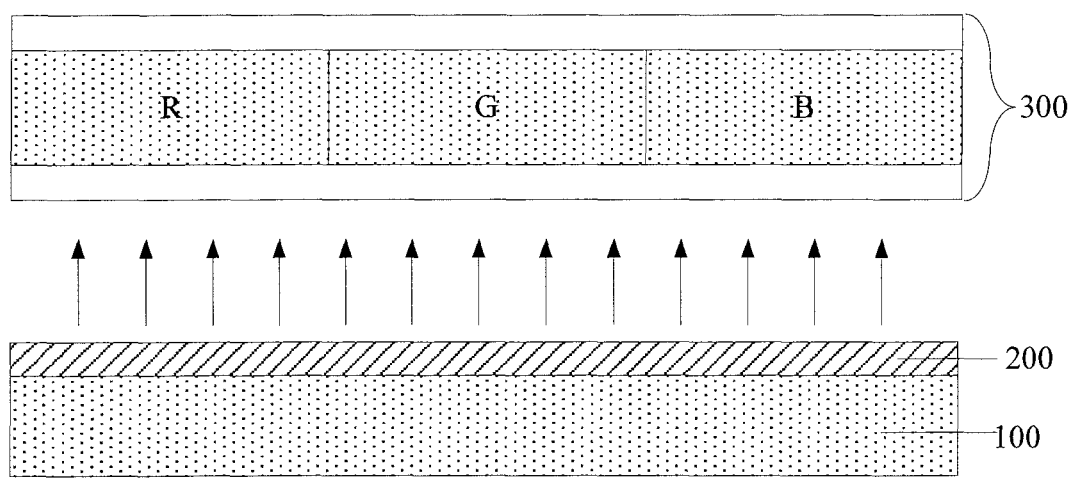
FIG. 10 illustrates a schematic structural cross-sectional view of a backlight module according to an embodiment of the disclosure.

Based on the same general technical concept of embodiments of the present disclosure, in a second aspect of the embodiments of the disclosure, there is provided a backlight module for a liquid crystal display panel 300, as illustrated in FIG. 10, comprising: a backlight source 100 configured to provide a light source for the liquid crystal display panel 300, the liquid crystal panel 300 comprising a plurality of pixels each of which comprise at least three sub-pixels of different colors.

The backlight module further comprises: a photonic crystal layer 200 located at a light-emergent side of the backlight source, in a region thereof corresponding to at least one of the sub-pixels of different colors of the liquid display panel 300, and the photonic crystal layer 200 being configured to filter a light ray in a predetermined waveband and to obtain a color of an emergent light from the region of the display panel corresponding to the at least one of the sub-pixels similar to an object color thereat As to the backlight module provided in the embodiment of the disclosure, since the photonic crystal layer may be provided in a region thereof corresponding to at least one of the sub-pixels of different colors of the display panel, and is for example configured to filter a light ray in a predetermined waveband, then, a fine adjustment on colors of emergent light emitted from the sub-pixels may further be implemented by the photonic crystal layer, such that a color of an emergent light from the region of the liquid crystal display panel corresponding to the at least one of the sub-pixels 30 may be similar to an intended object color thereat, so as to meet a requirement on various specification of colors of emergent light.

For example, in the backlight module provided in the embodiment of the disclosure, each pixel for example comprises sub-pixels of three different colors, comprising a red sub-pixel, a green sub-pixel and a blue sub-pixel; and the photonic crystal layer is at least provided in a region of the backlight module corresponding to the blue sub-pixel.

By way of example, in the backlight module provided in the embodiment of the disclosure, a portion of the photonic crystal layer provided in the region of the backlight module corresponding to the blue sub-pixel is configured to filter a light ray in a waveband between 380 nm and 435 nm;

a portion of the photonic crystal layer provided in a region of the backlight module corresponding to the red sub-pixel is configured to filter a light ray in a waveband between 415 nm and 435 nm; and a portion of the photonic crystal layer provided in a region of the backlight module corresponding to the green sub-pixel is configured to filter a light ray in a waveband between 515 nm and 525 nm.

By way of example, in the backlight module provided in the embodiment of the disclosure, the photonic crystal layer comprises a base film layer and micropores formed and distributed uniformly in the base film layer, the micropores having a refractive index smaller than that of the base film layer.

By way of example, in the backlight module provided in the embodiment of the disclosure, the base film layer is implemented as a polymeric material formed by a three-dimensional stacking of spherical polymer structures abutting one another tightly.

By way of example, in the backlight module provided in the embodiment of the disclosure, the base film layer is for example formed by a polymeric material formed by a three-dimensional stacking of one type of polystyrene microspheres, polymethylacrylic acid microspheres, and silicon dioxide microspheres.

Based on the same general technical concept of embodiments of the present disclosure, in another aspect of the embodiments of the disclosure, there is provided a display device, comprising any one display panel as above; or, there is provided a display device, comprising any one backlight module as above. The display device may for example be any product or a component having display function, such as: mobile phone, tablet computer, television set, display, laptop computer, digital photo frame, navigator and like. Embodiments of the display device may for example refer to above embodiments of the display panel or backlight module as above, without repeating any more.

The solutions of above embodiments of the disclosure have following beneficial technical effects:

A display panel, a backlight module and a display device are provided according to embodiments of the disclosure; the display panel comprising: a first substrate and a second substrate provided opposite to the first substrate, and a plurality of pixels arranged in an array between the first substrate and the second substrate, each pixel comprising at least three sub-pixels of different colors; and a region of the display panel corresponding to at least one of the sub-pixels of different colors is further provided with a corresponding photonic crystal layer (e.g., the photonic crystal layer is located on a side of the second substrate facing away from the first substrate), which is configured to filter a light ray in a predetermined waveband. Then, a fine adjustment on colors of emergent light emitted from the sub-pixels may further be implemented by the photonic crystal layer, such that a color of an emergent light from the region corresponding to the at least one of the sub-pixels may be similar to an intended object color thereat, so as to meet a requirement on various specification of colors of emergent light.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although the disclosure is described in view of the attached drawings, the embodiments disclosed in the drawings are only intended to illustrate the preferable embodiment of the present disclosure exemplarily, and should not be deemed as a restriction thereof.

Although several exemplary embodiments of the general concept of the present disclosure have been shown and described, it would be appreciated by those skilled in the art that various changes or modifications may be made in these embodiments without departing from the principles and spirit of the disclosure and lie within the scope of present application, which scope is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A display panel, comprising:
    a first substrate and a second substrate provided opposite to the first substrate, and
    a plurality of pixels arranged in an array between the first substrate and the second substrate, each pixel comprising at least three sub-pixels of different colors,
    wherein a region of the display panel corresponding to at least one of the sub-pixels of different colors is further provided with a photonic crystal layer, which is configured to filter a light ray in a predetermined waveband and to obtain a color of an emergent light from the region of the display panel corresponding to the at least one of the sub-pixels similar to an object color thereat;
    wherein the photonic crystal layer comprises a base film layer and micropores formed and distributed uniformly in the base film layer, the micropores having a refractive index smaller than that of the base film layer, and the base film layer is formed by a polymeric material formed by a three-dimensional stacking of spherical polymer structures abutting one another tightly.

2. The display panel according to claim 1, wherein each of the sub-pixels comprises a liquid crystal layer and a photoresist layer of a corresponding color; and
    wherein the photonic crystal layer is arranged in one of positional relationships relative to the first substrate, the second substrate and the crystal layer:
    the photonic crystal layer is located at a side of the first substrate facing towards the liquid crystal layer;
    the photonic crystal layer is located at a side of the second substrate facing towards the liquid crystal layer;
    the photonic crystal layer is located at a side of the first substrate facing away from the liquid crystal layer; and
    the photonic crystal layer is located at a side of the second substrate facing away from the liquid crystal layer.

3. The display panel according to claim 1, wherein each of the sub-pixels comprises an organic electroluminescent structure of a corresponding color; and
    wherein the photonic crystal layer is located at a light-emergent side of the organic electroluminescent structure.

4. The display panel according to claim 1, wherein each of the sub-pixels comprises a photoresist layer of a corresponding color and an organic electroluminescent structure which emits a white light, the photoresist layer being located at a light-emergent side of the organic electroluminescent structure; and
    wherein the photonic crystal layer is located at a light-emergent side of the organic electroluminescent structure, and one of the photonic crystal layer and the organic electroluminescent structure is arranged between the photoresist layer and the other of the photonic crystal layer and the organic electroluminescent structure.

5. The display panel according to claim 1, wherein each pixel comprises sub-pixels of three different colors, comprising a red sub-pixel, a green sub-pixel and a blue sub-pixel; and
    wherein the photonic crystal layer is at least provided in a region of the display panel corresponding to the blue sub-pixel.

6. The display panel according to claim 5, wherein a portion of the photonic crystal layer provided in the region corresponding to the blue sub-pixel is configured to filter a light ray in a waveband between 380 nm and 435 nm;
  a portion of the photonic crystal layer provided in a region corresponding to the red sub-pixel is configured to filter a light ray in a waveband between 415 nm and 435 nm; and
  a portion of the photonic crystal layer provided in a region corresponding to the green sub-pixel is configured to filter a light ray in a waveband between 515 nm and 525 nm.

7. The display panel according to claim 1, wherein the base film layer is formed by a polymeric material formed by a three-dimensional stacking of one type of polystyrene microspheres, polymethylacrylic acid microspheres, and silicon dioxide microspheres.

8. A display device, comprising the display panel according to claim 1.

9. A backlight module for a liquid crystal display panel, comprising a backlight source configured to provide a light source for the liquid crystal display panel, the liquid crystal panel comprising a plurality of pixels each of which comprise at least three sub-pixels of different colors,
  wherein the backlight module further comprises a photonic crystal layer located at a light-emergent side of the backlight source, in a region thereof corresponding to at least one of the sub-pixels of different colors of the liquid display panel, and the photonic crystal layer being configured to filter a light ray in a predetermined waveband and to obtain a color of an emergent light from the region of the display panel corresponding to the at least one of the sub-pixels similar to an object color thereat;
  wherein the photonic crystal layer comprises a base film layer and micropores formed and distributed uniformly in the base film layer, the micropores having a refractive index smaller than that of the base film layer, and the base film layer is formed by a polymeric material formed by a three-dimensional stacking of spherical polymer structures abutting one another tightly.

10. The backlight module according to claim 9, wherein each pixel comprises sub-pixels of three different colors, comprising a red sub-pixel, a green sub-pixel and a blue sub-pixel; and
  wherein the photonic crystal layer is at least provided in a region of the backlight module corresponding to the blue sub-pixel.

11. The backlight module according to claim 10, wherein a portion of the photonic crystal layer provided in the region of the backlight module corresponding to the blue sub-pixel is configured to filter a light ray in a waveband between 380 nm and 435 nm;
  a portion of the photonic crystal layer provided in a region of the backlight module corresponding to the red sub-pixel is configured to filter a light ray in a waveband between 415 nm and 435 nm; and
  a portion of the photonic crystal layer provided in a region of the backlight module corresponding to the green sub-pixel is configured to filter a light ray in a waveband between 515 nm and 525 nm.

12. The backlight module according to claim 7, wherein the photonic crystal layer comprises a base film layer and micropores formed and distributed uniformly in the base film layer, the micropores having a refractive index smaller than that of the base film layer.

13. The backlight module according to claim 12, wherein the base film layer is formed by a polymeric material formed by a three-dimensional stacking of spherical polymer structures abutting one another tightly.

14. The backlight module according to claim 13, wherein the base film layer is formed by a polymeric material formed by a three-dimensional stacking of one type of polystyrene microspheres, polymethylacrylic acid microspheres, and silicon dioxide microspheres.

15. A display device, comprising the backlight module according to claim 9.

* * * * *